United States Patent
Franosch et al.

(10) Patent No.: US 6,605,487 B2
(45) Date of Patent: Aug. 12, 2003

(54) METHOD FOR THE MANUFACTURE OF MICRO-MECHANICAL COMPONENTS

(75) Inventors: Martin Franosch, Munich (DE); Reinhard Wittmann, Untrschweinbach (DE); Catharina Pusch, Munich (DE)

(73) Assignee: Infineon Technologies Aktiengesellschaft, Münich (DE)

( * ) Notice: Subject to any disclaimer, the term of this patent is extended or adjusted under 35 U.S.C. 154(b) by 0 days.

(21) Appl. No.: 10/027,044

(22) Filed: Dec. 20, 2001

(65) Prior Publication Data

US 2002/0086455 A1 Jul. 4, 2002

(30) Foreign Application Priority Data

Dec. 21, 2000 (DE) .......................................... 100 63 991

(51) Int. Cl.$^7$ .............................................. H01L 21/00
(52) U.S. Cl. ..................................................... 438/50
(58) Field of Search ............................... 438/48, 50, 51, 438/52, 53

(56) References Cited

U.S. PATENT DOCUMENTS

| | | | |
|---|---|---|---|
| 4,949,148 A | | 8/1990 | Bartelink |
| 5,095,401 A | | 3/1992 | Zavracky et al. |
| 5,149,397 A | * | 9/1992 | Bol ............................... 216/2 |
| 5,316,979 A | * | 5/1994 | MacDonald et al. .......... 438/52 |
| 5,656,512 A | * | 8/1997 | Beitman ....................... 438/52 |
| 5,786,235 A | | 7/1998 | Eisele et al. |
| 5,981,308 A | * | 11/1999 | Lee ............................... 438/52 |
| 6,225,140 B1 | * | 5/2001 | Liu et al. ....................... 438/48 |
| 6,406,933 B1 | * | 6/2002 | Aigner et al. .................. 438/53 |

FOREIGN PATENT DOCUMENTS

| | | |
|---|---|---|
| DE | 43 14 888 | 8/1994 |
| DE | 196 03 829 | 8/1997 |
| DE | 198 47 455 | 4/2000 |
| EP | 0 783 108 | 7/1997 |

OTHER PUBLICATIONS

Elderstig et al, "Spin deposition of polymers over holes and cavities", *Sensors and Actuators*, 46–47 (1995), pp. 95–97.
Liu et al, "Sealing of Micromachined Cavities Using Chemical Vapor Deposition Methods: Characterization and Optimization", *IEEE Journal of Microelectromechanical Systems*, vol. 8, No. 2, Jun. 1999, pp. 135–145.

* cited by examiner

*Primary Examiner*—Long Pham
(74) *Attorney, Agent, or Firm*—Schiff Hardin & Waite (57) ABSTRACT

A method for the manufacture of micro-mechanical components from a stack of layers having at least a substrate, a sacrificial layer and a layer which is to be undercut includes forming at least one etch hole in the layer, which is to be undercut, and providing at least one passivation layer for controlling a selective depositing of a cover material which closes each of the etch holes after a step of etching the sacrificial layer. The passivation layer makes it possible that the undercut layer elements do not become excessively thick or grow together with the substrate due to the deposition of the cover material.

21 Claims, 6 Drawing Sheets

METHOD FOR THE MANUFACTURE OF MICRO-MECHANICAL COMPONENTS

BACKGROUND OF THE INVENTION

The invention is directed to a method for the manufacture of micro-mechanical components with undercut layer elements.

Micro-mechanical components are being increasingly employed in pressure sensors, microphones, acceleration sensors, switches, micro-pipetting units, electrical biological protection and other apparatus. The micro-mechanical manufacturing methods enable a high degree of miniaturization, so that the advantages of a monolithic integration with a micro-electronically manufactured read-out or control electronics can be simultaneously utilized. In this way, micro-mechanical components can be manufactured in a large number of pieces in a compact, reliable and cost-beneficial way.

Figure 1A:
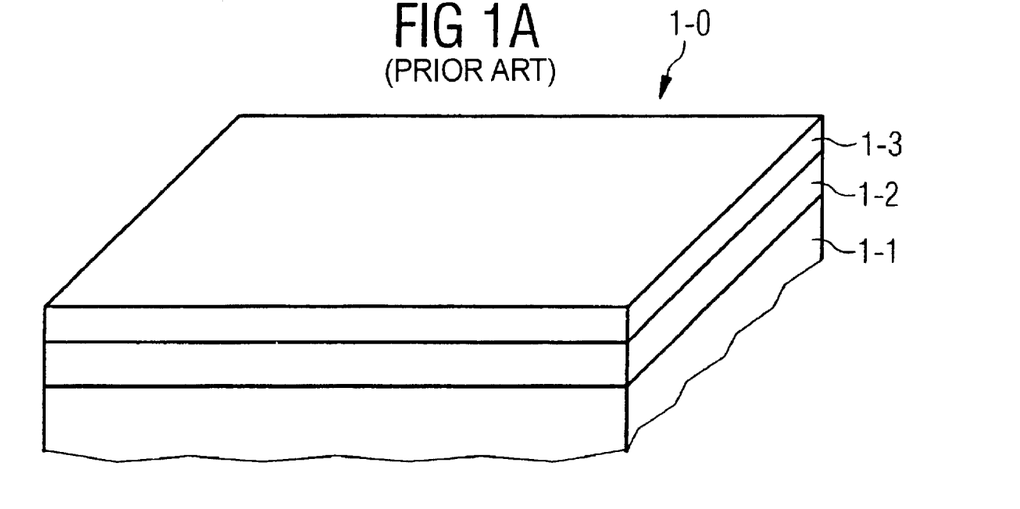
FIGS. 1A–1C are perspective views illustrating steps in a method for manufacturing undercut layer elements according to the prior art.
Figure 1B:
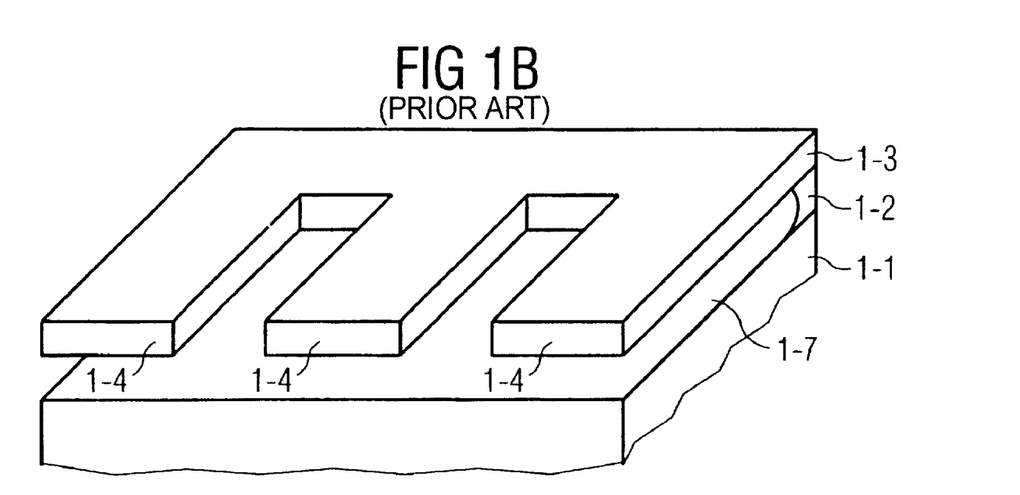

The manufacture of undercut layer elements plays a particular part in the generation of micro-mechanical components. What are understood by undercut layer elements are the regions of layers that do not lie on any foreign layer. Examples of undercut layer elements are micro-mechanical membranes, bridges, webs and the like. The manufacture of undercut layer elements for micro-mechanical components is usually implemented as follows (see FIGS. 1A–1D): a layer stack 1-0 having a substrate 1-1 of silicon, what is referred to as a sacrificial layer 1-2 applied thereon and composed, for example, of silicon oxide, and, applied thereon, a layer 1-3, which is to be undercut, is provided or generated (FIG. 1A). The layer 1-3, which is to be undercut, is often composed of polysilicon or of epitaxially grown silicon. In order to be able to undercut parts of the layer 1-3, the layer 1-3, which is to be undercut, must be opened or exposed, for example with the assistance of photolithographic methods. In FIG. 1B, the opening ensues by a structuring of the layer 1-3, which is to be undercut, for example to form three bars that are connected at one side. When the sacrificial layer 1-2 is then isotropically etched, the sacrificial layer 1-2 is also etched under the three bars, so that the three bars develop into undercut layer elements 1-4 given an adequately long etching time. Hollow regions 1-7 in the region between undercut layer elements 1-4 and substrate 1-1 are thereby simultaneously generated. FIG. 1B also shows that the sacrificial layer 1-2, due to the limited etching time, has remained only in the connecting region of the three bars 1-4. The remaining region of the sacrificial layer 1-2 in this embodiment serves as a support for the three undercut bars 1-4.

This method, however, has disadvantages. First, it is not possible with this method to manufacture membranes that lie on a sacrificial layer hermetically tight on all sides since, in this case, the layer, which is to be undercut, is not structured and, thus, no openings are present through which the sacrificial layer can be etched. Second, there is the problem for generating large-area, undercut layer elements because the necessary undercutting by the isotropic etching step can last for a very long time. For example, the etching time may last up to two hours in order to etch cavities having an average volume of 400 $\mu m^3$ with 10% hydrofluoric acid and a sacrificial layer composed of silicon oxide. Given these long etching times, moreover, the reproducibility for a planarly exact structuring of the sacrificial layer is established to only a limited extent. This long etching time can also result in that parts of the sacrificial layer, which, for example, should remain in place for supporting purposes, are occasionally likewise removed.

For solving this problem, small openings, what are referred to as etch holes, are additionally generated or formed in the layer, which is to be undercut, and these holes have the task of producing an optimally large attack area on the sacrificial layer lying therebelow for the isotropically etching medium. The etch holes can thereby comprise round shapes but can also comprise non-round shapes such as, for example, slot-shaped forms and can also be potentially adapted to the desired shape of the undercut layer elements to be generated.

It is advantageous for many applications that the etch holes are in turn closed after the isotropic etching. First, the undercut layer elements can thus largely regain their mechanical or electrical stability and, second, it may be necessary that the undercut layer elements cover structures on the substrate or, as in the case of pressure sensors, should form a hermetically tight closure.

Figure 1C:
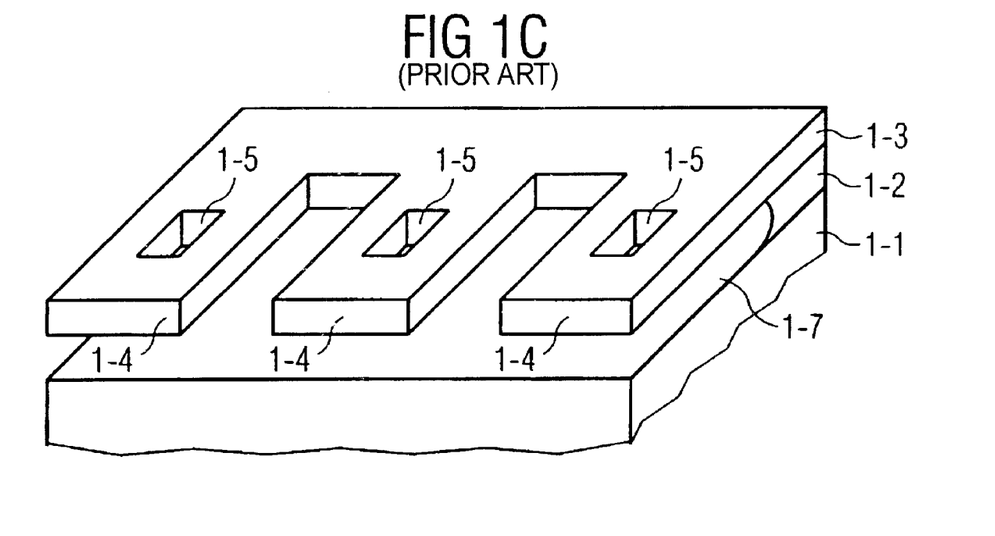

So that the etch holes can be unproblemmatically closed with a cover material, the etch holes should have optimally small diameters. FIG. 1C schematically shows the micro-mechanical component of FIG. 1B with the three undercut bars 1-4, with each bar being provided with an additional etch hole 1-5. The etching time can be shortened in this way, so that the supporting region of the sacrificial layer 1-2 was enlarged in comparison to the device in FIG. 1B. In this drawing, the etch holes are far larger compared to the bar structure size then in reality for reasons of presentation.

The materials of the layer stack 1-0 in this method are selected, so that the structuring of the layer 1-3, which is to be undercut, can occur by etching selectively relative to the sacrificial layer 1-2 lying therebelow. In addition, the materials should allow the sacrificial layer 1-2 to be removed with wet-chemical methods without the layer 1-3 being destroyed. For example, the sacrificial layer 1-2 is composed of a silicon oxide and the layer 1-3 is composed of episilicon or polysilicon. The episilicon or polysilicon layer can be wet-chemically etched with a base such as KOH (large structures) or, when the micro-mechanical dimensions lie on the order of magnitude of a few $\mu m$ or smaller, can be dry-chemically etched with gases in a plasma (for example, $Cl_2$, Hbr or $SF_6$ gases or mixtures of gases).

The sacrificial layer of silicon oxide 1-2 is removed, for example, with a solution containing hydrofluoric acid (diluted HF or diluted NF3/HF) that does not attack the layer 1-3 of silicon, which is to be undercut and lies thereabove. The attack of the etching chemicals on the sacrificial layer 1-2 ensues via the open regions of the layer 1-3 which include the etch holes 1-5. Typical dimensions of the etch hole diameter, which is dependent on the geometry of the micro-mechanical elements, lie in the range of a few 10 nm through a number of micrometers.

Figure 1D:
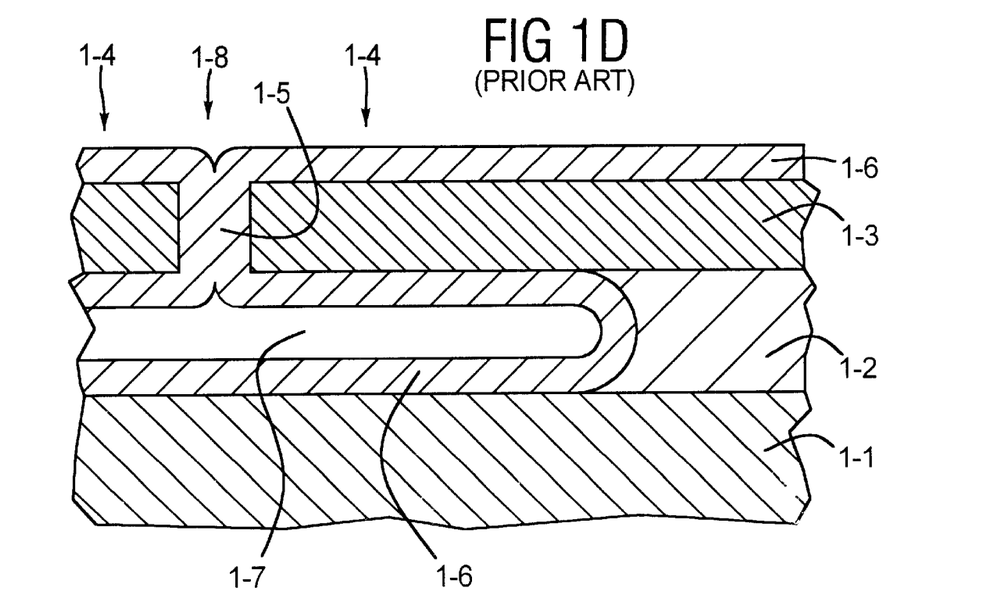
FIG. 1D is a partial cross-sectional view of a closed etch hole according to the prior art.

The closure of the etch holes is usually achieved by a deposition of a cover material. As a result of diffusion, the cover material, however, also proceeds into the hollow regions 1-7 and deposits thereat. FIG. 1D shows a cross-section through the micro-mechanical component shown in FIG. 1C after the deposition of the cover material 1-6. The layer thickness of the cover material 1-6 required for closing the etch holes, however, also generates a layer in the hollow region 1-7 that increases the layer thickness of the undercut layer elements and modifies the mechanical or electrical behavior.

The size of the etch holes is dependent on the overall process execution with which the undercut layer elements 1-4 are manufactured. Further, their size is dependent on the planned final thickness of the layer elements 1-4 to be undercut. The diameter of the etch holes 1-5 must be all the smaller for the undercut layer elements with a thinner ultimate thickness. Etch holes having a diameter greater than 50 nm and smaller than 5 μm are thus currently being used.

A method of covering or closing etch holes with a small diameter is disclosed in European Patent Application EP 0 783 108 A1. Therein, the etch holes are closed by the deposition of a flowable BPSG layer (Boro-Phosphorous Silicate Glass). One disadvantage of this method, however, is that the undercut layer elements or, respectively, membrane layers are then no longer composed only of episilicon or polysilicon but of various materials having different material properties. This can lead to mechanical stresses between the materials. Further, the compatibility for the following process steps is usually diminished. Finally, a BPSG layer can give off gases due to its doping, so that an undesired excess pressure can be formed in the cavity given membranes which are to be hermetically sealed.

SUMMARY OF THE INVENTION

The present invention is therefore based on the object of offering a method that alleviates or, respectively, entirely avoids the above-recited difficulties.

This object is achieved by the method for manufacturing micro-mechanical components according to the following embodiments. Further advantageous embodiments, developments and aspects of the present invention derive from the dependent patent claims, from the specification and from the attached drawings.

Inventively, a first embodiment of the method for the manufacture of micro-mechanical components with undercut layer elements is offered comprising the following steps:
  a) providing a layer stack which has a substrate with a sacrificial layer applied thereon and a first layer, which is to be undercut, being applied onto the sacrificial layer;
  b) forming or generating at least one etch hole through the first layer which is to be undercut;
  c) isotropically etching the sacrificial layer so that undercut or underetched layer elements are generated or formed;
  d) passivating the surface regions between the undercut layer elements and the substrate to form a passivation layer thereon;
  e) selectively depositing a cover material relative to the passivation layer so that each etch hole is closed.

Inventively, another or second embodiment of the method for the manufacture of micro-mechanical components having undercut layer elements is offered that comprises the following steps:
  a) providing a layer stack that comprises a first passivation layer applied on a substrate, a sacrificial layer applied on the passivation layer and a first layer which is to be undercut applied on said sacrificial layer;
  b) forming or generating at least one etch hole through the first layer which is to be undercut;
  c) isotropically etching the sacrificial layer, so that undercut layer elements are generated or formed;
  d) selectively depositing a cover material relative to the first passivation layer, so that each etch hole is closed.

Inventively, a third embodiment of the method is offered for the manufacture of micro-mechanical components having undercut layer elements that comprises the following steps:
  a) providing or forming a layer stack that comprises a sacrificial layer applied on a substrate, a second passivation layer applied on the sacrificial layer and a first layer, which is to be undercut, applied on said second passivation layer;
  b) generating or creating at least one etch hole through the first layer which is to be undercut and through the second passivation layer;
  c) isotropically etching the sacrificial layer, so that undercut layer elements are generated; and
  d) selectively depositing a cover material relative to the second passivation layer, so that each etch hole is closed.

The inventive method makes it possible that the etch holes are closed with the same material as that of the undercut layer elements, so that the undercut elements are composed of a uniform material after the closure of each etch hole. The uniform material of an undercut layer element avoids mechanical stresses and unwanted chemical reactions between layers composed of different materials and simplifies the further process management.

These advantages are enabled by the selective deposition of the cover material with respect to the passivations in the surface region between the undercut layer elements and substrate. The passivation, which can also be inventively generated with the assistance of first or second passivation layer, effects that, given a suitable process management, the cover material preferably deposits on surfaces that do not comprise a passivated surface. What is achieved in this way is that the deposition of cover material is suppressed in the region between the undercut layer elements and substrate, whereas the deposition of the cover material on the upper side of the undercut layer elements is continued unimpaired for closing the etch holes.

Due to the suppression of the deposition of cover material in the region between the undercut layer elements and the substrate, a greater quantity of cover material can be deposited for covering the etch holes without too much cover material being deposited in the region to be undercut, and this deposit in the region to be undercut, in the worst case, potentially leads to the fact that the undercut layer element and the substrate grow together due to the cover material. Having the undercut layer element and substrate grow together with cover material would destroy the characteristic of the undercut layer elements, which would visciate functions of the undercut layer elements such as, for example, as membranes, pressure sensors or as electrical cavity protection. Further, the growth of the layer thickness and, thus, falsifications of the mechanical or electrical behavior of the undercut layer elements are clearly reduced.

The etch holes serve the purpose of expanding the attack area of the isotropically etching medium onto the sacrificial layer, so that large-area layer elements can also be undercut in a predetermined etching time. In this way, the structural size of an undercut layer element to be produced can be selected largely independent of the etching time and this enhances the freedom of design for undercut layer element structures.

What are to be understood by undercut layer elements are the regions of the layers lying on the sacrificial layer that, as a result of the isotropic etching of the sacrificial layer, no longer rest on the sacrificial layer. In the case of the second embodiment, the undercut layer elements are preferably composed of regions of the layer which is to be undercut. In the case of the first and third embodiments, the undercut layer elements are preferably composed of regions of the layer which is to be undercut and of regions of the passivation layer.

On principle, the etch holes can assume any shape as long as they are small enough in order to be closed up again during the deposition of the cover material. They can therefore be round, oval or polygonal holes having adequately small diameters but can also be, for example, slots that are adequately narrow. Preferably, the etch holes are generated simultaneously with the structuring of the layer to be etched, for example for the manufacture of a bridge. Preferably, the etch holes are thereby manufactured in a photolithographic process.

The isotropic etching effects a lateral etching of the sacrificial layer, so that sacrificial layer material is also removed under the layer which is to be undercut, i.e. between the layer which is to be undercut and the substrate. Since the isotropic etching does not largely chemically attack the first layer, which is to be undercut, regions of the first layer are undercut and thus form undercut layer elements. By continuing the isotropic etching, it is also possible that neighboring undercut layer elements grow and form a large, common underetched layer element. When, for example, many underetched layer elements have been generated by means of a plurality of neighboring etch holes, then a large undercut layer element can be generated by a continuation of the isotropic etching. Preferably, the isotropic etching is generated with a wet-chemical etching step.

The process management for the deposition of the cover material is selected so that the cover material grows on the upper side of the layer, which is to be undercut, or on the sidewalls of the etch holes with a growth rate that is many times greater than on the passivated or passivation layers. The passivated surfaces between the undercut layer elements and the substrate assure that the cover material that has penetrated by diffusion into the cavity regions under the undercut layer elements do not deposit or deposit only very slowly on the substrate or on the underside of the undercut layer elements. As a result, the undercut layer elements and the substrate can be prevented from growing together due to the deposits of the cover material or the undercut layer can be prevented from becoming thicker than wanted.

In the first embodiment of the method, the passivation with respect to the cover material is achieved by a passivation that is generated after the isotropic etching on the surfaces between the undercut layer elements and the substrate. The passivation can be applied or can also be generated at the surface (for example, by thermal oxidation). Differing from the first and second passivation layer, the passivation can lie in regions between the undercut layer elements and the substrate three-dimensionally. In the other embodiments of the method, the passivation layer, in contrast, is provided by at least one passivation layer that has been introduced into the layer stack before the structuring and that is only in turn uncovered by the isotropic etching.

The inventive closing of the etch holes with the cover material assumes that the upper side or surface of the undercut layer elements or the sidewalls of the etch holes are largely free of the passivation or passivation layer. What is thereby to be understood here as well as below by the upper side or surface is the side or surface of the undercut layer elements that does not face toward the substrate. The upper side of the undercut layer elements or the sidewalls of the etch holes are required as seating surface for the deposition of the cover material with which the etch holes are closed.

In a preferred embodiment, the upper side of the undercut layer elements is kept free of passivation in that, following a passivation step, the passivation on the upper side of the undercut layer elements is in turn removed. The removal of the passivation on the upper side of the undercut layer elements is thereby preferably accomplished by a largely anisotropic etching step.

In a preferred embodiment, the etch holes comprise slanting sidewalls that are funnel-shaped, so that the sidewalls of the etch holes are also free of passivation coating after the anisotropic etching of the upper sides of the undercut layer elements. As a result thereof, the cover material can also be deposited onto sidewalls of the etch holes during the deposition of the cover material, and this will accelerate the closing of the etch holes. In particular, what can thus also be achieved is that the etch holes are closed without requiring an additional layer application of the cover material on the upper side of the undercut layer elements. As a result thereof, the undercut layer elements can retain their original layer thickness regardless of the etch hole diameters to be closed.

Preferably, the anisotropic etching process is set so that the etching rate on the surface of the substrate is more than 10% lower than the etching rate on the surface of the undercut layer elements. This can be set, for example, via an adequately short, free path length of the etching gas in the reactor. What this method assures is that the passivation of the upper side of the undercut layer elements is completely removed by the anisotropic etching, whereas the passivation on the substrate directly under the open regions of the layer to be undercut and, in particular, under the etch holes is still present.

In another preferred embodiment, the upper side of the first layer, which is to be undercut, is covered with a protective layer before the generation of the passivation, and the protective layer prevents the generation of a passivation on the upper side of the first layer, which is to be undercut. As a result thereof, the anisotropic etch step for the elimination of the passivation on the upper side of the first layer, which is to be undercut, can be eliminated. Preferably, the protective layer is in turn removed after the generation of the passivation.

Preferably, the substrate comprises silicon on the surface. In a first preferred embodiment, the passivation is a silicon oxide that is generated thermally or in a deposition process in the surface region between the undercut layer elements and the substrate. In a second preferred embodiment, the passivation is a silicon nitride. The generation of a passivation of silicon oxide or silicon nitride on the surface regions, which are preferably composed of silicon, occurs with methods according to the prior art.

In the method of the second embodiment, the layer stack comprises a first passivation layer that is arranged between the substrate and the sacrificial layer. The first passivation layer is composed of a material, preferably silicon nitride, that suppresses an agglomeration in the deposition of the cover material. The first passivation layer is partially or completely uncovered in the isotropic etching of the sacrificial layer. In this way, the deposition of cover material is largely suppressed in the region between the undercut layer elements and the substrate.

In the method of the third embodiment, the layer stack comprises a second passivation layer that is arranged between sacrificial layer and the layer, which is to be undercut. The second passivation layer is likewise composed of a material, preferably silicon nitride, that suppresses an agglomeration of the cover material in the deposition of the cover material.

The etch holes generated according to the method of the third embodiment lead or extend through the first layer, which is to be undercut, and through the second passivation layer. Regions of the surface of the second passivation layer are uncovered due to the isotropic etching of the sacrificial layer. The undercut layer elements are thus composed of elements of the second passivation layer and of the first layer, which is to be undercut. By uncovering regions of the second passivation layer, the deposition of the cover material is largely suppressed on the undersides of the undercut layer elements. In addition, the growth of the layer thickness of the undercut layer elements by the cover material is reduced.

The layer stack preferably comprises a first passivation layer and a second passivation layer. The first passivation layer is of the type described in the second embodiment and is arranged between the substrate and the sacrificial layer; and the second passivation layer is of the type described in the third embodiment and is arranged between sacrificial layer and the first layer. In this way, the isotropic etching of the sacrificial layer can uncover both regions of the first passivation layer on the substrate as well as regions of the second passivation layer on the underside of the undercut layer elements. The deposition of cover material is thus suppressed both on the substrate as well as on the undersides of the undercut layer elements. As a result thereof, the quantity of cover material with which the etch holes are to be covered can be increased by a multiple without running the risk of having the underetched layer elements and the substrate unintentionally grow together due to depositions of the cover material.

Preferably, the layer stack comprises a third passivation layer on the layer, which is to be undercut, so that the cover material is also deposited selectively relative to the third passivation layer. The etch holes thereby lead or extend through the third passivation layer and through the first layer, which is to be undercut. As a result of the third passivation layer, the deposition of cover material on the upper side of the under-etched or undercut layer elements is suppressed. The growth of the layer thickness of the underetched layer elements during the closing of the etch holes is thus suppressed, so that the undercut layer elements retain their mechanical or electrical properties. In a preferred embodiment, the layer stack comprises both first, second as well as third passivation layers. In this way, the cover material in the region of the etch holes can now only be deposited at the sidewalls of the etch holes. In this way, the etch holes can be closed by the cover material without the layer thickness of the undercut layer elements increasing.

The cover material and the material of the undercut layer elements are preferably composed of the same material. As a result thereof, the material-related uniformity of the undercut layer elements is assured, and this will prevent mechanical stresses and chemical reactions due to different material properties and facilitate further process management.

The substrate is preferably composed of a semiconductor material and, in particular of silicon, since a multitude of technological means for the application and structuring of layers exists for this type of substrate.

Above all, the substrate serves as a seating surface for the passivation layers or sacrificial layers. Its surface can be pre-structured and pre-treated in many ways before the generation of the layer stack. In a preferred fashion, the substrate is a semiconductor substrate having a microelectronic circuit applied before the generation of the layer stack or having micro-mechanical elements applied before the generation of the layer stack. What is therefore also to be understood by substrate is a semiconductor substrate with structured layers of other materials applied on the surface. In this way, a multitude of micro-mechanical elements can be produced together with the sacrificial layer elements to be generated and together with the layer elements to be undercut. In particular, micro-mechanical elements and microelectronic circuits can be monolithically integrated with one another in a compact and cost-beneficial way in this fashion.

The sacrificial layer is preferably composed of silicon oxide, polygermanium, undoped polysilicon or silicon nitride, dependent on the materials that comprise the first layer, which is to be undercut, and the passivation layers. The sacrificial layer is preferably composed of silicon oxide when the layer, which is to be undercut, is composed of silicon, silicon nitride or silicon carbide. The sacrificial layer is preferably composed of undoped polysilicon when the layer, which is to be undercut, is composed of silicon oxide or silicon nitride. The sacrificial layer is preferably formed of nitride when the layer, which is to be undercut, is composed of silicon or silicon carbide.

In another preferred embodiment, the sacrificial layer is structured before a second passivation layer or the layer, which is to be undercut, are applied. In this way, the design possibility of micro-mechanical elements are clearly enhanced. For example, what can thus be achieved is that the undercut layer elements also lie directly on the substrate in regions.

Preferably, the first layer, which is to be undercut, is composed of silicon, particularly of polysilicon or epitaxily grown silicon, of silicon carbide, of silicon oxide or silicon nitride. Layers of silicon nitride and silicon oxide have the advantage that they are transparent in the optical range, so that, for example given a membrane layer, one can see through the membrane layer into the hollow region for measurement and observation purposes. Silicon carbide has the advantage of a high temperature resistance. Silicon has the advantage of a simple processibility, a good temperature conductivity, a humidity-repellant surface and a good durability. All layers can be applied in a defined way onto the sacrificial layers or onto the passivation layers and, for example, can be structured with photolithographic processes.

Preferably, the first, the second or the third passivation layer as well are composed of silicon nitride ($Si_3N_4$), of silicon oxide, polysilicon or monocrystalline silicon, and are dependent on what materials are to be used for the covering and for the layer, which is to be undercut. A passivation layer of silicon oxide can be utilized relative to a cover layer of nitride that is to be grown on the layer of nitride, which is to be undercut. The passivation layer of silicon, i.e. undoped or doped polysilicon or monocrystalline silicon, can be utilized as a passivation layer relative to a cover layer of silicon oxide that is to be grown on the first layer of silicon oxide. In addition, a passivation layer of silicon nitride can be utilized as the passivation layer relative to a cover layer of silicon or silicon carbide that is to be grown on a first layer of silicon or silicon carbide. Preferably, the first and second and, preferably, the third passivation layer as well are composed of the same material. The same passivation layer material facilitate the manufacturing process and the setting of the process management parameters for the deposition of the cover material.

Preferably, the first and second passivation layer are less than 1000 nm and, preferably, less than 5 nm thick. The passivation layers preferably serve only for the passivation of surfaces and preferably have no significant mechanical or electronic influence on the micro-mechanical component. Since, in a preferred embodiment, the undercut layer elements comprise material of the second passivation layer and material of the first layer, the mechanical stresses within the undercut layer elements generated by material differences can be kept slight given a thin second passivation layer.

In an advantageous embodiment, the third passivation layer is structured so that, in addition to the surfaces to be closed, deposition regions are defined for the production of electrically conductive components. Advantageously, the deposition of the cover material for closing the etch holes can be simultaneously utilized for the generation of electronic circuit elements, interconnects or mechanical structures. When the cover material is composed, for example of polysilicon, then resistors, contact terminals or interconnects or interconnect levels can be simultaneously generated with the closing of the etch holes. This can eliminate one or more mask steps.

When the first layer is composed of an electrically conductive material, then deposition regions are preferably generated on the regions of the first layer, which is to be undercut, and these are electrically insulated from other undercut layer elements. Otherwise, the electronic circuit elements to be generated would be electrically conductively connected by the undercut layer elements and could potentially short out one another. An undercut layer element can thus also be conductively connected.

The inventive methods are applied for generating undercut layer elements regardless of whether the undercut layer element is unstructured such as, for example, in the case of a membrane or structured such as, for example, in the case of bridges, webs and switches and the like. When the layer, which is to be undercut, is to be structured, then the structuring is preferably implemented in one step together with the generation of the etch holes.

The invention is presented in greater detail below with reference to Figures of the drawings.

DESCRIPTION OF THE PREFERRED EMBODIMENTS

Figure 2A:
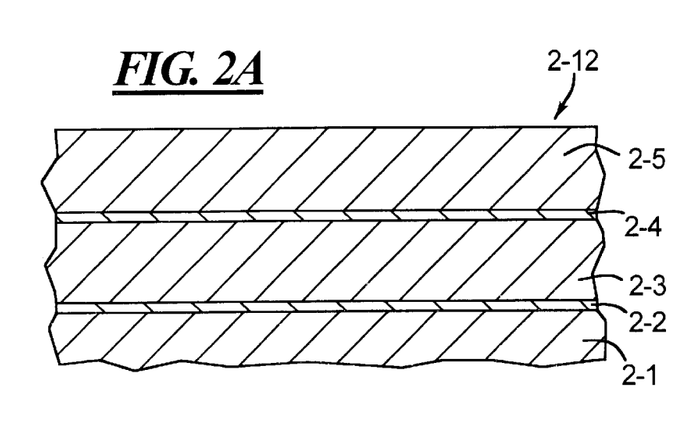
FIGS. 2A–2D are partial cross-sectional views showing steps of a first embodiment of an inventive method for manufacturing undercut layer elements with etch holes and two passivation layers.
Figure 2B:
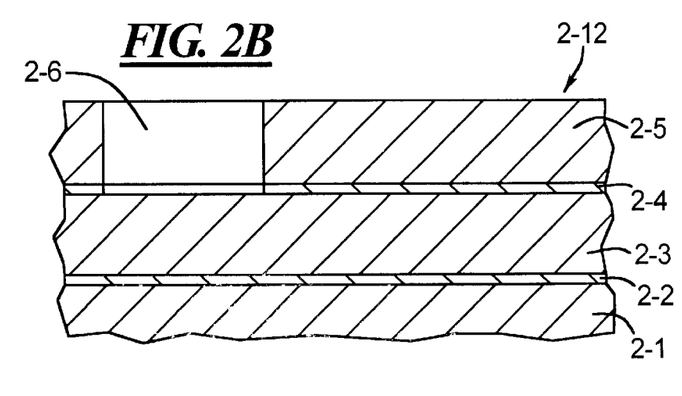
Figure 2C:
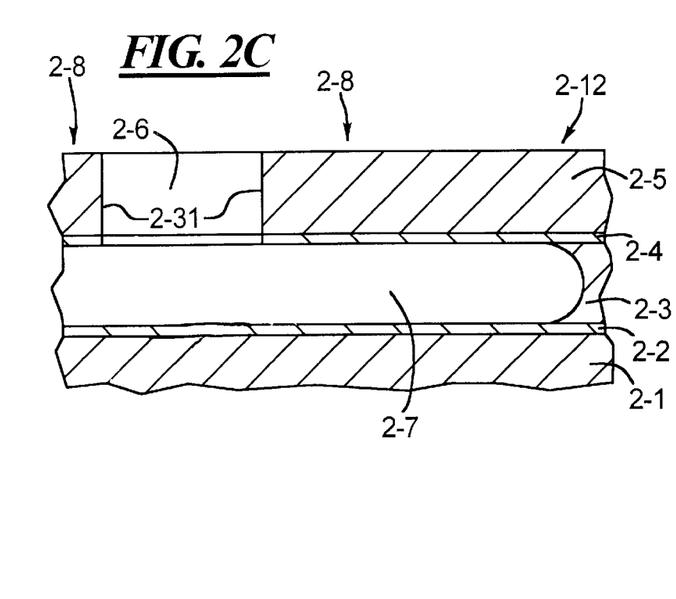
Figure 2D:
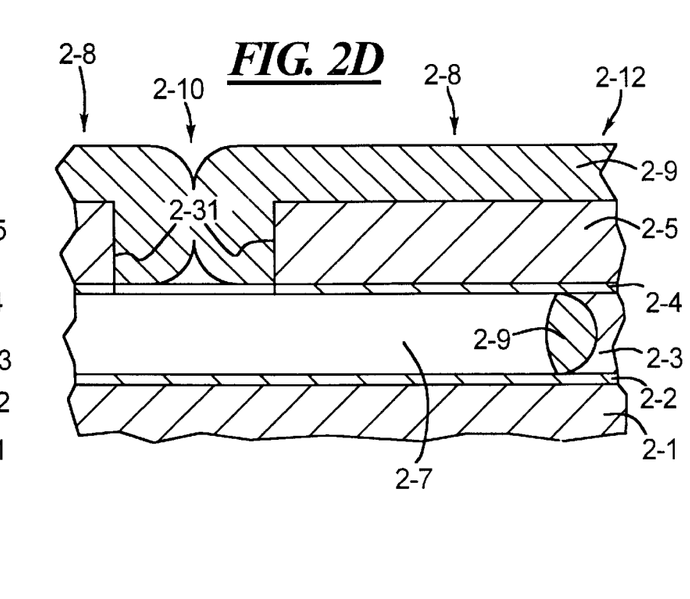
Figure 3A:
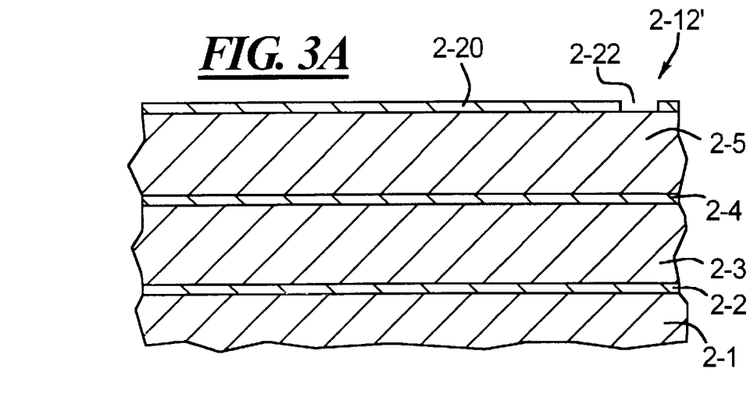
FIGS. 3A–3D are partial cross-sectional views showing steps of a second embodiment of an inventive method for manufacturing undercut layer elements with etch holes and three passivation layers given simultaneous generation of an electrical contacting terminal with the layer to be undercut.
Figure 3B:
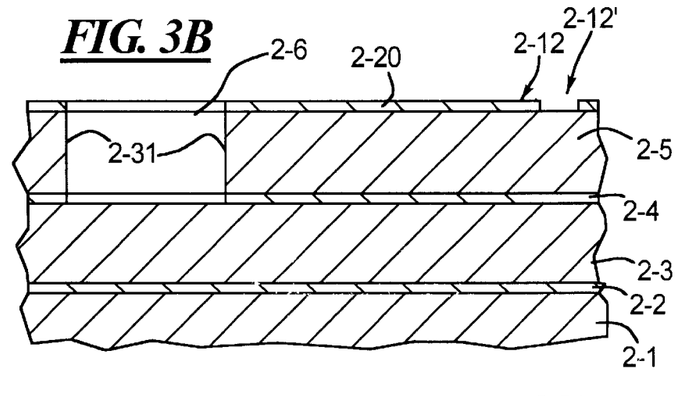
Figure 3C:
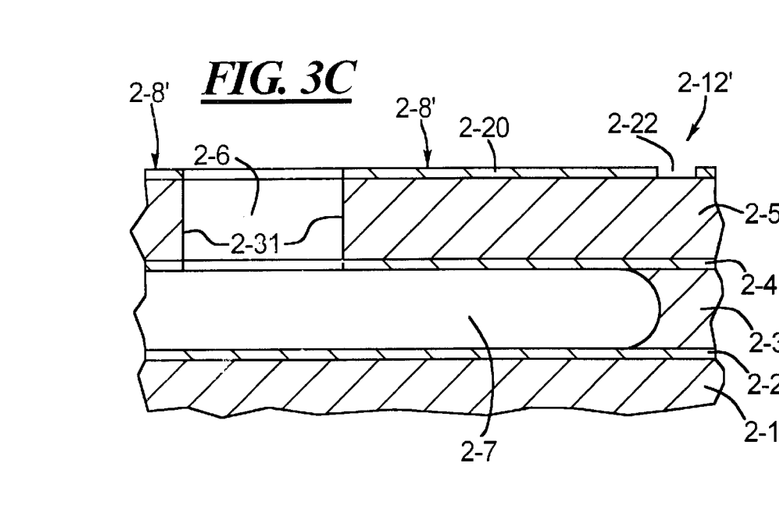
Figure 3D:
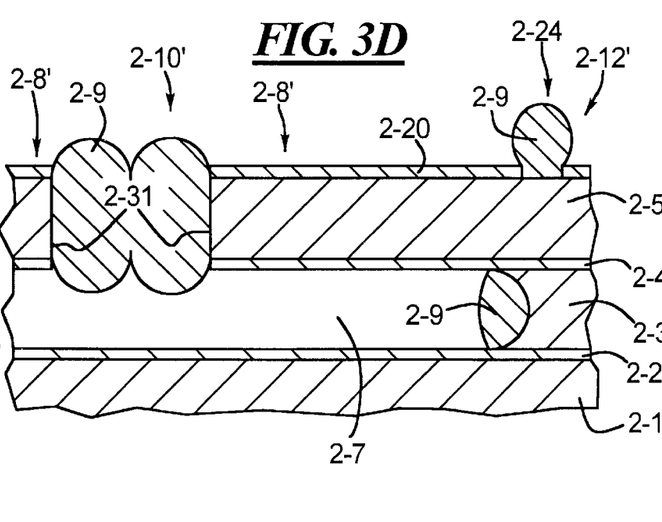
Figure 4A:
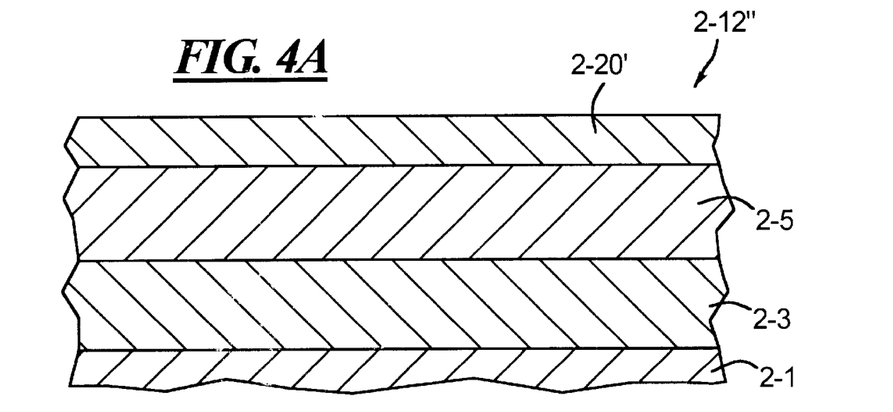
FIGS. 4A–4F are partial cross-sectional views showing steps of a fourth embodiment of an inventive method for manufacturing undercut layer elements with etch holes and passivation.
Figure 4B:
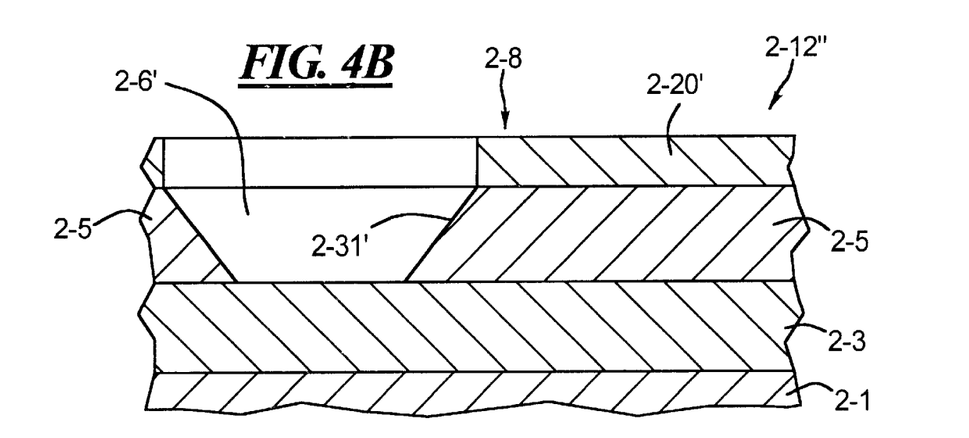
Figure 4C:
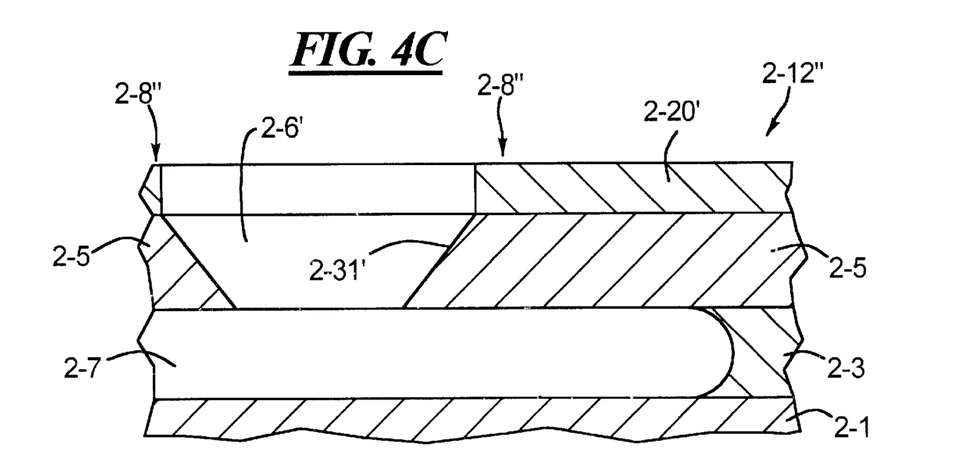
Figure 4D:
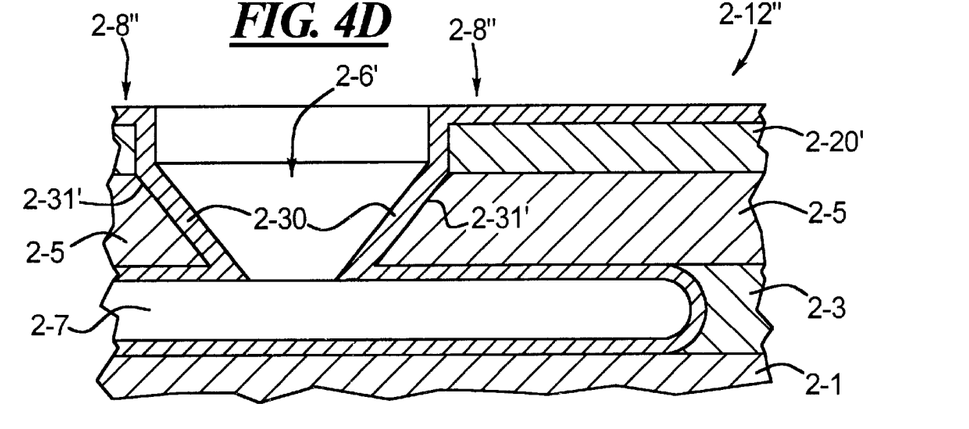
Figure 4E:
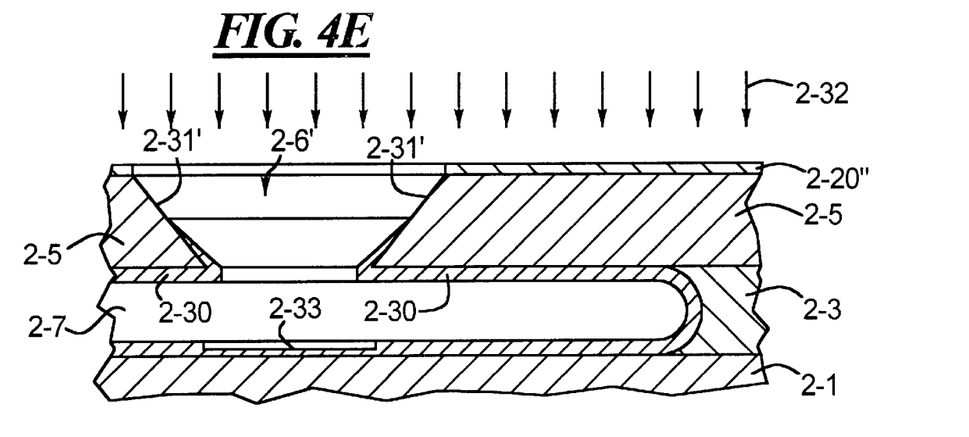
Figure 4F:
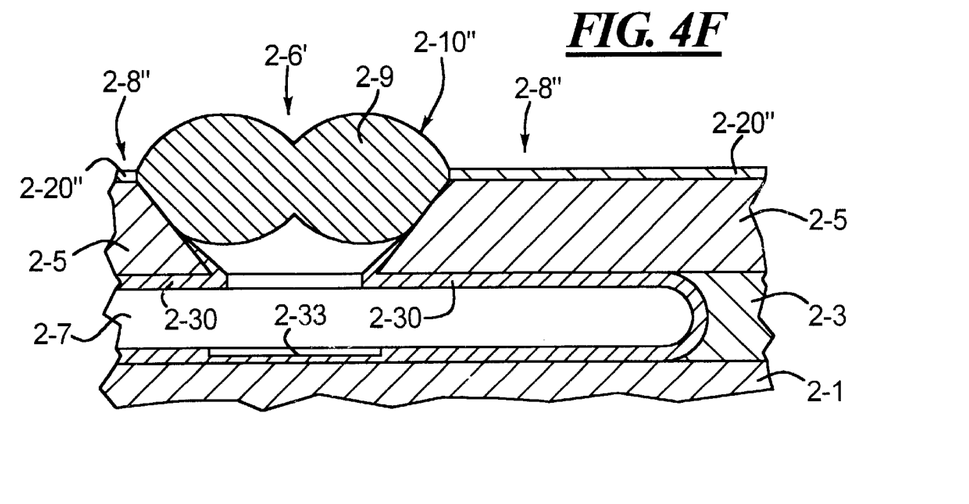

The principles of the present invention are useful to provide micro-mechanical components with undercut layer elements illustrated in FIG. 2D, FIG. 3D or FIG. 4F.

FIGS. 2A through 2D schematically describe the executive sequence of a first embodiment of an inventive method for manufacturing micro-mechanical components with undercut layer elements having etch holes that are to be inventively closed. The spacings and dimensions of the following Figures are thereby to be understood qualitatively and not to scale unless expressly stated otherwise. FIG. 2A shows a portion from a layer stack 2-12 that comprises a substrate 2-1, a first passivation 2-2 applied thereon, a sacrificial layer 2-3 applied on the first passivation layer 2-2, a second passivation layer 2-4 applied on the sacrificial layer 2-3 and a first layer 2-5, which is to be undercut, applied on the second passivation layer 2-4. The substrate 2-1 is preferably composed of silicon and, for example, is a silicon wafer. The first and second passivation layers 2-2 and 2-4 are preferably composed of silicon nitride that, for example, is deposited on the substrate 2-1 or, respectively, on the sacrificial layer 2-3 in a standard LPCVD process. The thickness of the silicon nitride layers is preferably clearly thinner than the thickness of the sacrificial layer 2-3. A typical value for the thickness of the silicon nitride layers 2-2 and 2-4 is, for example, 20 nm.

The sacrificial layer 2-3 is preferably a silicon oxide and is likewise deposited on the first passivation layer 2-2 in a standard method. However, it can also be thermally generated, for example, in that, for example, a polysilicon layer is first deposited and this is then thermally oxidized. The thickness of the sacrificial layer is dependent on the application and sequence of process steps. It is preferably large enough so that the first layer 2-5, which is to be undercut, and the substrate 2-1 do not come into contact with one another after the deposition of the cover material. In the present embodiment, the sacrificial layer 2-3 is approximately 500 nm thick.

The first layer 2-5, which is to be undercut, is preferably composed of silicon. In the one preferred embodiment, the silicon is deposited on the second passivation layer 2-4 as an undoped polysilicon. In another preferred embodiment, the silicon is deposited on the second passivation layer 2-4 as a polysilicon that is doped. The doped polysilicon layer deposition can thus be simultaneously employed as a material for a wiring level on a micro-electronic circuit (not shown here). The required thickness of the layer 2-5 is dependent on the application and on the processing steps. In the present embodiment, the layer 2-5 is approximately 500 nm thick.

FIG. 2B schematically shows a portion of the layer stack 2-12 after the generation or formation of the etch holes 2-6 through the layer 2-5 and through the second passivation layer 2-4. Preferably, the etch holes 2-6, which have side walls or edges 2-31, are generated with the assistance of a standard photolithographic process, whereby the photolithographic step can also be utilized for generating a prescribed structure, for example for generating a bridge or a bar. FIG. 2B representatively shows only the structure of an etch hole 2-6. As a rule, however, a multitude of etch holes are generated in the first layer 2-5 when large-area structures to be undercut are to be generated, for example membranes. The etch holes in this embodiment have a diameter of, for example, 1 µm. The etch holes having diameters of this size are simple to manufacture in technological terms and enable a fast etching of the sacrificial layer 2-3. The spacing of neighboring etch holes from one another is approximately 10 µm through 20 µm in the present embodiment.

FIG. 2C schematically shows a portion of the layer stack 2-12 after the isotropic etching of the sacrificial layer 2-3. The isotropic etching leads to the undercutting of the first layer 2-5 and of the second passivation layer 2-4, so that the first layer 2-5 and second passivation layer 2-4 form an undercut layer element 2-8. The isotropic etching in the present exemplary embodiment is preferably implemented chemically-wet and, preferably, with a 20% HF acid. The isotropic etching is preferably implemented at least until the sacrificial layer 2-3 is etched through down to the first passivation layer 2-2. In this way, the first passivation layer 2-2 is uncovered in order to suppress the deposition of cover material thereon during a later step. Preferably, the isotropic etching continues to be implemented at least until the arising hollow regions 2-7 of neighboring etch holes contact one another and the sacrificial layer 2-3 has been largely removed in the regions covered by the etch holes 2-6. In view of the spacing of neighboring etch holes in this embodiment, this requires an undercutting over a range of at least 5–10 µm.

FIG. 2D schematically shows a portion of the layer stack 2-12 after a cover material 2-9 has been selectively deposited. For a good selectivity, the cover material, which is polysilicon and is deposited in a LPCVD process, for example with a Centura HT, is deposited with the assistance of dichloro silane (100 sccm), H2 (25 slm) and Hcl (50 sccm) at a temperature range of approximately 850° C. through 900° C. with a pressure of 6 Torr. The good conformity of the polysilicon deposition effects a fast lateral growth of the polysilicon cover material 2-9 in the region of the side walls or edges 2-31 of the etch holes 2-6 and, thus, fastly form a closure 2-10 for each etch hole.

As a result of the uncovered first and second passivation layers 2-2 and 2-4, the cover material 2-9 deposits nearly only on the upper sides and side edges of the layer 2-5. The first and second passivation layers 2-2 and 2-4 thus constitute no risk that the cover material 2-9 will fill the hollow region 2-7 when the etch holes 2-6 are closed.

Given an etch hole with a 1 µm diameter, the layer thickness of the cover material 2-9 on the layer 2-5 must be at least 500 nm thick so that the etch hole 2-6 can be completely covered. The hollow regions 2-7 under the undercut layer elements 2-8 are thereby not filled up. The selection of polysilicon as a cover material continues to see to it that the undercut layer elements 2-8 are thoroughly composed of the same material, namely silicon, whereby the extremely thin, second passivation layer 2-4 of, for example, silicon nitride is thereby merely left out of consideration.

FIGS. 3A through 3D show the sequence for another embodiment of the inventive method for manufacturing undercut layer elements with etch holes that are closed and three passivation layers. FIG. 3A schematically shows a portion from a layer stack 2-12' that differs from the stack 2-12 of FIG. 2A merely on the basis of the third passivation layer 2-20 that is applied onto the layer 2-5. The third passivation layer 2-20 is likewise preferably a silicon nitride layer that is likewise preferably thin compared to the sacrificial layer 2-3. In the present embodiment, the third passivation layer is approximately 20 nm thick; however, this does not denote any limitation with respect to other possible layer thicknesses.

In addition, the third passivation layer 2-20 comprises a structuring with which a deposition region 2-22 is defined on the first layer 2-5 and on which cover material is later deposited. The cover material on the deposition regions 2-22 can assume different functions in the micro-mechanical component dependent on layout and doping. It can have mechanical functions, for example for stabilizing a membrane; however, it can also assume electronic functions. When the cover material is composed of a doped polysilicon, an interconnect for the electronic contacting of the undercut layer can be simultaneously generated with the closing of the etch holes in this way. In this way, for example, a monolithic integration of a micro-mechanical component with a micro-electronic circuit can ensue. The structuring for generating the deposition region 2-22 preferably occurs by means of a photolithographic process.

In an additional step, preferably by means of photolithographic structuring, the third passivation layer 2-20 is opened for generating the etch holes 2-6 that extend through the third passivation layer 2-20, the first layer 2-5 and second passivation layer 2-4 (FIG. 3B). The isotropic etching of the sacrificial layer 2-3 follows analogous to the etching shown in FIG. 2C, so that undercut layer elements 2-8' and hollow regions 2-7 are produced (FIG. 3C).

FIG. 3D schematically shows a portion of the layer stack 2-12' after the deposition of the cover material 2-9, which, again, is preferably polysilicon in the present embodiment. The cover material has been applied with the same method as described in FIG. 2D. As a result of the third passivation layer 2-20, the cover material 2-9 can only be deposited on the layer 2-5 in the region of the deposition region 2-22, where it forms an electrically conductive contact terminal 2-24 for contacting the electrically conductive, undercut layer element 2-8'. As a result of the doping concentration of the cover layer, the electronic resistance of the contact terminal 2-24 can also be set.

Beyond the deposition region 2-22, the cover material 2-9 in this embodiment can only be deposited at the edges of the layer 2-5, particularly at the sidewalls 2-31 of the etch holes 2-6, and, in case the sacrificial layer 2-3 does not act as passivation, at the edges of the remaining sacrificial layer 2-3 as well. In this way, the etch holes 2-6 can be closed with the closure 2-10' without the undercut layer elements 2-8' being made thicker due to the deposition of the cover material 2-9.

When, as in the present case, the cover material 2-9 is identical to the material of the first layer 2-5, then undercut layer elements 2-8' that are uniform in terms of material can be produced, of the same type as would have been obtained without etch holes. The undercut layer elements 2-8' are thus lent better mechanical stability and can be more easily further-processed. The mechanical modification of the layer to be undercut that was caused by the generation of the etch holes can thus be in turn reversed.

FIGS. 4A through 4D show another embodiment of the inventive method. The layer stack 2-12" in this embodiment is composed of the substrate 2-1 of silicon; of the sacrificial layer 2-3 of silicon oxide, which is applied on the substrate 2-1 and has a thickness of, for example, 300 nm; of the first layer 2-5, which is to be undercut, is applied on the sacrificial layer 2-3 and is composed, for example, of polysilicon with a thickness of, for example, 400 nm; and of a third passivation layer 2-20', which is applied on the first layer 2-5 and is composed of silicon nitride having a thickness of approximately 60 nm (FIG. 4A). The thickness of the third passivation 2-20' is selected of such a size that a covering of the first layer 2-5 by the passivation layer 2-20' still remains after a later preform anisotropic etching for removing a portion of the passivation layer.

FIG. 4B shows the layer stack 2-12" with an etch hole 2-6' that leads through the first layer 2-5 and through the passivation layer 2-20'. In this embodiment, the diameter of the etch hole 2-6' is approximately 500 nm. For reasons to be explained later, the sidewalls 2-31' of the etch holes 2-6' are obliquely etched funnel-shaped by one of the methods at the command of a person skilled in the art. The angle in this embodiment amounts to approximately 80° through 90°.

FIG. 4C shows the micro-mechanical component after the isotropic etching of the sacrificial layer 2-3 that uncovers the undercut layer elements 2-8" and parts of the surface of the substrate 2-1 and thus generates the hollow region 2-7. FIG. 4D shows the micro-mechanical component after the generation of the passivation layer 2-30 composed of nitride. In this embodiment, the passivation 2-30 is approximately 20 nm thick. The passivation layer 2-30 extends over the open silicon surfaces of substrate 2-1 and the surface of the first layer 2-5.

FIG. 4E shows the structure during an anisotropic dry etching with a standard dry etching gas 2-32. The process management of the dry etching is set so that the free path length of the etching gas, which is less than 300 nm in this embodiment, in the etch reactor is so short in the region of the substrate that the etching rate of the dry etching gas 2-32 is higher in the upper region of the etch hole 2-6' than in the lower region of the etch hole 2-6' and is in turn higher in the lower region than in the hollow region 2-7 on the surface of the substrate 2-1. The duration of the anisotropic etching is therefore preferably set so that the passivation layer 2-30 in the upper region of the sidewall 2-31' of the etch hole 2-6' is largely removed, whereas the passivation layer 2-30 of the substrate 2-1 under the etch hole 2-6' remains in an adequate way. The remaining portions 2-20'' of the third passivation layer 2-20' is, in fact, thinned but still a passivating layer due to its initially greater layer thickness, as shown when comparing layers 2-20' of FIG. 4D and layers 2-20'' of FIG. 4E. Only one step 2-33 in the passivation layer can be seen in the region under the etch hole 2-6'.

FIG. 4F shows the micro-mechanical component after cover material 2-9 of silicon has been selectively deposited, for example in a LPCVD process. The cover material is again polysilicon that is deposited in a LPCVD process, for example with a Centura HT, with the assistance of dichlorosilane (100 sccm), H2 (25 slm) and Hcl (50 sccm) at a temperature of approximately 850° C. through 900° C. and at a pressure of 6 Torr. The cover material 2-9 deposits selectively on the silicon surfaces, so that it largely grows only on the sidewall 2-31' of the etch hole 2-6' to form a closure 2-10''. The etch holes 2-6' can be closed in this way, whereby the cover material 2-9 is identical to the material of the first layer 2-5 and the original layer thickness of the first layer 2-5 is preserved. Subsequently, the third passivation layer 2-20'' is preferably removed, so that the undercut layer elements 2-8'' are composed only of silicon, apart from a thin passivation layer 2-30.

Although various minor modifications may be suggested by those versed in the art, it should be understood that we wish to embody within the scope of the patent granted hereon all such modifications as reasonably and properly come within the scope of our contribution to the art.

We claim:

1. A method for the manufacture of micro-mechanical components with at least one undercut layer element, said method comprising the steps of providing a layer stack that has a sacrificial layer, applied on a substrate and a first layer, which is to be undercut, applied on the sacrificial layer; forming at least one etch hole in the first layer; isotropically etching the sacrificial layer so that the at least one undercut layer element is created; creating a passivation layer on the surface region between the at least one undercut layer element and the substrate; and selectively depositing a cover material relative to the passivation layer so that each etch hole is closed.

2. A method according to claim 1, wherein the passivation layer is composed of a material selected from a group consisting of silicon oxide and silicon nitride.

3. A method according to claim 1, which includes the step of removing the passivation layer from an upper side of the at least one undercut layer element before the step of depositing the cover material.

4. A method according to claim 3, wherein the step of removing the passivation layer on the upper surface of the at least one undercut layer element comprises isotropic etching.

5. A method according to claim 4, wherein the step of forming at least one etch hole forms an etch hole with a slanting funnel-shaped sidewall.

6. A method according to claim 4, wherein the step of isotropically etching has an etch rate on the surface of the substrate which is more than 10% below an etch rate on the upper surface of the at least one undercut layer element.

7. A method according to claim 3, wherein the step of depositing the cover material deposits a cover material which is the same as the material forming the first layer.

8. A method according to claim 1, wherein the substrate is composed of a semiconductor material.

9. A method according to claim 1, wherein the sacrificial layer is selected from a group consisting of silicon oxide, undoped polysilicon, silicon nitride and polygermanium.

10. A method according to claim 1, wherein the first layer is composed of a material selected from a group consisting of silicon, polysilicon, epitaxially grown silicon, silicon nitride, silicon oxide and silicon carbide.

11. A method according to claim 1, wherein the step of forming at least one etch hole includes structuring the first layer.

12. A method for manufacturing micro-mechanical components with at least one undercut layer element, said method comprising the steps of providing a layer stack having a substrate, with a first passivation layer on said substrate, a sacrificial layer being applied on the first passivation layer, and a first layer, which is to be undercut, being applied on the sacrificial layer; forming at least one etch hole through the first layer; isotropically etching the sacrificial layer to create the at least one undercut layer element; and selectively depositing a cover material relative to the first passivation layer so that each etch hole is closed.

13. A method according to claim 12, wherein the step of providing a stack provides a stack which includes a second passivation layer applied on the sacrificial layer between the sacrificial layer and the first layer and the step of forming at least one etch hole forms an etch hole through both the second passivation layer and the first layer.

14. A method according to claim 13, which includes applying a third passivation layer on the first layer prior to the step of selectively depositing the cover material, so that the cover material is deposited selectively relative to the third passivation layer.

15. A method according to claim 13, wherein the second passivation layer is composed of a material selected from a group consisting of silicon nitride and silicon oxide.

16. A method according to claim 13, wherein the first and second passivation layers have a layer thickness less than 1000 nm.

17. A method according to claim 16, wherein the first and second passivation layers have a layer thickness of less than 50 nm.

18. A method according to claim 12, wherein the first passivation layer is a material selected from a group consisting of silicon nitride, silicon oxide, polysilicon and monocrystalline silicon.

19. A method for manufacturing micro-mechanical components with undercut layer elements, said method comprising the steps of providing a layer stack having a substrate, a sacrificial layer applied on the substrate, a passivation layer and a first layer, which is to be undercut; creating at least one etch hole through the first layer and through the passivation layer; isotropically etching the sacrificial layer so that the at least one undercut layer element is generated; selectively depositing a cover material relative to the passivation layer.

20. A method according to claim 19, wherein the passivation layer is on an outer surface of the first layer and which includes, prior to the step of selectively depositing the cover material, forming another passivation layer on the first-mentioned passivation layer and on the surface region between the at least one undercut layer element and the substrate, so that the cover material is deposited selectively relative to the two passivation layers.

21. A method according to claim 19, wherein the passivation layer is a material selected from a group consisting of silicon nitride and silicon oxide.

* * * * *